United States Patent [19]
Gindrup et al.

[11] Patent Number: 5,892,476
[45] Date of Patent: Apr. 6, 1999

[54] ELECTROMAGNETIC RADIATION ABSORPTIVE COMPOSITION CONTAINING INORGANIC COATED MICROPARTICLES

[75] Inventors: Wayne Laval Gindrup, Hickory; Rebecca Reeves Vinson, Conover; Christopher Richard Sutter, Hickory, all of N.C.

[73] Assignee: Spectro Dynamics Systems, L.P., Norcross, Ga.

[21] Appl. No.: 681,767

[22] Filed: Apr. 8, 1991

Related U.S. Application Data

[63] Continuation-in-part of Ser. No. 612,622, May 21, 1984, Pat. No. 4,624,865, Ser. No. 702,684, Feb. 19, 1985, Pat. No. 4,624,798, and Ser. No. 933,829, Nov. 24, 1986.

[51] Int. Cl.$^6$ .................................................... H01Q 17/00
[52] U.S. Cl. ................................ 342/1; 252/583; 523/137
[58] Field of Search ................................ 342/1; 252/583; 523/137

[56] References Cited

U.S. PATENT DOCUMENTS

| | | | |
|---|---|---|---|
| 4,137,361 | 1/1979 | Deffeyes et al. | 428/328 |
| 4,912,070 | 3/1990 | Mitani | 502/5 |

*Primary Examiner*—Mark Hellner
*Attorney, Agent, or Firm*—James W. Kayden; Thomas, Kayden, Horstemeyer & Risley, LLP

[57] ABSTRACT

A strong lightweight composition containing inorganic coated microparticles which, when dispersed in a binder, produce a matrix having broad band absorption properties for electromagnetic radiation in the infrared and microwave regions and is useful as a thin coating or as a structural composite material in various applications for multispectral absorbers. The microparticles have a mean diameter of from 1 to 500 microns and are coated with the reaction product of a metal and a nonmetal.

21 Claims, No Drawings

ELECTROMAGNETIC RADIATION ABSORPTIVE COMPOSITION CONTAINING INORGANIC COATED MICROPARTICLES

CROSS REFERENCE TO RELATED APPLICATIONS

This application is a continuation-in-part of commonly owned co-pending application Ser. No. 612,622 filed May 21, 1984, now U.S. Pat. No. 4,624,865 granted Nov. 25, 1986, and a continuation-in-part of commonly owned co-pending application Ser. No. 702,684 filed Feb. 29, 1985, now U.S. Pat. No. 4,624,798, granted Nov. 25, 1986, and a continuation-in-part of commonly owned co-pending application Ser. No. 06/933,829 filed Nov. 24, 1986 pending.

BACKGROUND OF THE INVENTION

The above-noted commonly owned and co-pending U.S. Pat. Nos. 4,624,798 and 4,624,865 disclose novel electrically conductive microparticles in the form of metal coated magnetic ceramic microspheres, methods for producing these microspheres, and also describe their usefulness in forming electrically conductive coatings or composites for various applications. We have now discovered novel infrared absorbing compositions consisting of microparticles coated with certain inorganic materials.

Various materials, such as carbon black and other dark pigments, have been used in the past to absorb infrared radiation. While various pigments used in the past absorb a portion at the infrared region, they become highly reflective in other portions of the infrared. These compositions all suffer the disadvantage that the binder used to hold the pigment is reflective in the infrared region and detracts from the effectiveness of the absorber particle. These systems utilize a dispersion of the absorber particles such that the energy must penetrate some distance into the binder to reach the particles. A further disadvantage of this approach is the difficulty of simultaneously obtaining the critical dispersion distance for the particles and the strict requirements for the particle size. Prior technology utilizing such pigments is unable to obtain uniform and strong absorption over the 0.5 to 25 micron bandwidth. Coatings utilizing the prior art could not be integrated into ultrawide band electromagnetic absorbers due to the inherent high dielectric constant of the pigments which cause high reflectivity of the coatings in the microwave region of the electromagnetic spectrum.

The present invention provides a strong, light-weight composition containing coated microparticles. The composition has very broad band absorption properties for electromagnetic radiation in the infrared region and is effective when used as a thin coating or as a structural composite material. It can withstand very high temperatures (900 degrees C.) and is generally limited only by the binder in this respect. In contrast to the prior art, these coated particles require much less of the reflective binder to achieve good physical properties and the size of the coated particles is such that the particles extend above the binder surface exposing the absorber to the incident radiation with little interference by the binder. The composition has the advantage of being transparent in the microwave region and may readily be used in conjunction with other absorbers to obtain an absorber which is effective in both the microwave and infrared regions. It has the added advantage of absorbing sound and is a good thermal insulator displaying decreased emissions when placed over substrates radiating in the far infrared. It may be easily applied to a substrate with conventional spray equipment.

SUMMARY OF THE INVENTION

The present invention, more particularly, provides an electromagnetic radiation absorptive composition which comprises essentially water insoluble microparticles having a diameter of from 1 to 500 microns, said microparticles having an essentially water insoluble inorganic coating comprised of one or more of the reaction products of one or more of the following metals: silver, nickel, copper, iron, palladium, cobalt, chromium, manganese, cadmium, tin, lead, antimony, tungsten, molybdenum, zinc, and their alloys reacted with one or more of the following non-metallic elements: nitrogen, phosphorus, arsenic, silicon, oxygen, sulfur, selenium, tellurium, fluorine, chlorine, bromine, iodine, boron, or mixtures of these elements. The best results occur when the reaction product occurs as a thin film on the surface of the microparticle. The particle utilized in this invention may be defined as a particle having a mean diameter of from 1 to 500 microns with an aspect ratio of less than 10 to 1, said particle being essentially comprised of inorganic materials. The preferred material consists of very lightweight particles consisting mainly of alumina and silica with a hollow or foamed core. An example would be commercially available cenospheres or hollow glass microspheres obtainable from the PQ Corporation, Valley Forge, PA. These particles may be coated with any of the aforementioned metals by the techniques outlined in U.S. Pat. No. 4,624,865, or by other methods known to those skilled in the art. These metal coated particles may then be reacted with the vapor or volatile compounds of the non-metallic elements previously listed. This produces a strong coherent film of the metal derivative on the surface of the particle. These very thin films of reaction products have unexpectedly been found to exhibit unique absorption characteristics in the infrared region of the electromagnetic spectrum.

The inorganic coated microparticles may then be mixed with organic or inorganic binders to produce coating compositions or composite materials. When used in paint coatings, the microparticle to binder weight ratio may vary over wide percentages depending on the final physical performance desired. At low binder weights, the coating is light in weight, but not as physically strong. At very high binder weights the coating is very tough but may contain insufficient absorber particles to achieve good infrared absorption. At weight ratios near 1 to 1, the microparticles enhance the strength of typical plastic binders such as urethanes, epoxies or polyesters. This 1 to 1 ratio gives coatings with excellent physical and absorptive properties. A unique feature of these coatings is their transparency at microwave frequencies, allowing a layered coating to be produced which is absorptive in the microwave and infrared regions. These coatings being comprised of materials with extremely poor heat transfer are also effective in shielding objects which emit radiation in the far infrared. As an additional advantage, these infrared absorptive microparticles can be blended with infrared reflective materials to match the background reflectance.

DETAILED DESCRIPTION OF THE INVENTION

A preferred form of the infrared absorptive particles consists of coating 5–75 micron cenospheres with a layer of silver 500 angstroms thick and exposing this material to selenium vapors at temperatures between 150 and 250 degrees Centigrade such that the selenium reacts with the silver converting the silver layer to a layer of silver selenide. This material appears as a light-weight, fluffy, dark gray powder. This material when prepared as a coating with an equal weight of two-component polyurethane prepolymers and sprayed onto a brass substrate gives a measured reflectance at an angle of 20 degrees of 10% or less for wavelengths from 0.5 microns to 25 microns. As a comparison, the starting silvered microparticles give a reflectance in excess of 50% across the band under the same conditions and the starting ceramic gives reflectances near 50% in the 1 to 6 micron region. While many materials are good absorbers over narrow portions of the infrared spectrum between 0.5 and 25 microns, the silver selenide composition demonstrates the extremely wide and strong absorption of this invention. The military requirement to avoid targeting of weapon platforms by active infrared laser guided munitions and targeting lasers which typically could be neodymium YAG operating at 1.06 microns, carbon dioxide lasers operating at 10.6 microns, or perhaps other lasers operating in the infrared at other frequencies demonstrates the need for a material with a strong absorption over a wide bandwidth. This material has also been found to have high transmission in the microwave region which allows it to be used as the top coating over radar absorbing coatings. If a graded dielectric coating is prepared utilizing the radar absorptive materials as outlined in Ser. No. 06/933,829, the coating exhibits absorption of −20 to −25 dB's over the wide frequency range of about 5 GHz to 20 GHz. A requirement of this graded dielectric coating is the very low reflectance in the microwave region of the topmost layer. This layer may be prepared by utilizing the silver selenide coated particles without affecting the absorption characteristics in the microwave region. Such a construction exhibits extremely wide band absorption at both microwave and infrared frequencies.

The following non-limiting examples are intended to further illustrate the properties and potential uses of materials containing the infrared absorptive microparticles of the invention.

EXAMPLE #1

A 500 ml. Ehrlenmeyer flask was charged with 50 grams of 5–75 micron cenospheres coated with 10% by weight silver. 2 grams of finely powdered selenium metal were added and mixed with the spheres. The flask was lightly stoppered and set on a hot plate at high heat. Within an hour black specks began to appear on the surface of the shiny cenospheres. The flask was shaken occasionally during the next 8 hours of heating to disperse the selenium as it reacted. After 8 hours the cenospheres had become a uniform, very dark gray powder and were allowed to cool. Electrical conductivity measurements of the gray powder indicated that no appreciable conductivity remained. The gray powder was then mixed with an equal weight of urethane polymer and sprayed on a polyethylene sheet. Upon drying the film was removed and tested for reflectance at 10 GHz. The film's reflectance when compared to an equal sized aluminum panel was more than −30 dBs less. The same mixture was sprayed on a brass panel, brass having a characteristic absorption in the infrared region. The coated brass panel was tested for absorption between 0.5 and 25 microns at a 20 degree angle. The coating reflected less than 10% at all wavelengths.

EXAMPLE #2

A 500 ml. Ehrlenmeyer flask was charged with 50 grams of 5–75 micron cenospheres coated with 10% by weight silver. 0.8 gram of finely powdered sulfur was added and mixed with the spheres. The flask was lightly stoppered and set on a hot plate at high heat. Within an hour black specks began to appear on the surface of the shiny cenospheres. The flask was shaken occasionally during the next 8 hours of heating to disperse the sulfur as it reacted. After 8 hours the cenospheres had become a uniform, very dark gray powder and were allowed to cool. Electrical conductivity measurements of the gray powder indicated that no appreciable conductivity remained. The gray powder was then mixed with an equal weight of urethane polymer and sprayed on a polyethylene sheet. Upon drying the film was removed and tested for reflectance at 10 GHz. The film's reflectance when compared to an equal sized aluminum panel was more than −30 dBs less.

EXAMPLE #3

A 500 ml. Ehrlenmeyer flask was charged with 50 grams of 5–75 micron cenospheres coated with 14.8% by weight nickel. 8.2 grams of finely powdered sulfur were added and mixed with the spheres. The flask was lightly stoppered and set on a hot plate at high heat. The flask was shaken occasionally during the next 8 hours of heating to disperse the sulfur as it reacted. After 8 hours the cenospheres had become a uniform, very dark gray powder and were allowed to cool. Electrical conductivity measurements of the gray powder indicated that no appreciable conductivity remained. The gray powder was then mixed with an equal weight of urethane polymer and sprayed on a polyethylene sheet. Upon drying the film was removed and tested for reflectance at 10 GHz. The film's reflectance when compared to an equal sized aluminum panel was more than −30 dBs less.

EXAMPLE #4

A small crucible was charged with 5 grams of 5–75 microns cenospheres coated with 13% by weight nickel and placed in a muffle furnace at 360 degrees Centigrade for 1 hour. Upon cooling, the originally gray particles had become a clean, medium blue color. This material no longer had any magnetic properties or electrical conductivity and was essentially transparent to microwave radiation in the X band. A sample of the neat material was measured for reflectance in the region from 2 to 25 microns. The reflectance of the blue material was less than 9% across the total band.

EXAMPLE #5

A small crucible was charged with 5–75 micron cenospheres coated with 7.75% by weight phosphorus doped nickel and placed in a muffle furnace for 30 minutes at 380 degrees Centigrade. Upon cooling the originally gray particles had become brick red in color. The material no longer had any magnetic properties or electrical conductivity and was essentially transparent to microwave radiation in the X band. A sample of the neat material was measured for reflectance in the region from 2 to 25 microns. The reflectance of the brick red material was approximately 25% from 6 though 25 microns, falling to about 13% at 2 microns.

EXAMPLE #6

A 500 ml. flask was charged with 100 ml. of 1,1,1-trichloroethane and 0.4 gram iodine. This mixture was stirred magnetically until the iodine was dissolved. To this solution were added 25 grams of silvered cenospheres having a silver thickness of 900 angstroms. The mix was shaken for one minute, at which time the shiny silvered beads became a brick colored reddish powder and the 1,1,1-trichloroethane solution became colorless. The particles were filtered, washed with acetone, and dried. This material is photochromic, becoming gray when exposed to light and returning to the original brick red color when no light is present. This material, when dispersed in a two-component urethane, demonstrated absorption of microwave energy in the X band region.

That which we claim is:

1. An electromagnetic radiation absorptive composition which comprises an inorganic particle, essentially insoluble in water, with a size between 1 and 500 microns and with an aspect ratio less than 10 to 1 which may be hollow, porous, or solid, coated with an essentially water insoluble inorganic composition; wherein said inorganic coating composition comprises one or more of the compounds formed when one or more of the following metals: silver, nickel, copper, iron, palladium, cobalt, chromium, manganese, cadmium, tin, lead, antimony, tungsten, titanium, vanadium, zirconium, aluminum, molybdenum, zinc, or their alloys is reacted with one or more of the following non-metallic elements: nitrogen, phosphorus, arsenic, silicon, oxygen, carbon, sulfur, selenium, tellurium, fluorine, chlorine, bromine, iodine, and boron.

2. The composition according to claim 1 wherein said particles comprise small solid, hollow, or porous glass particles.

3. The composition according to claim 1 wherein said particles comprise small solid, hollow, or porous ceramic particles.

4. The composition according to claim 1 wherein said particles comprise cenospheres derived from the ash of coal-fired furnaces.

5. The composition according to claim 1 wherein said inorganic coating is present at a level of from 0.01% to 200% by weight.

6. An electromagnetic radiation absorptive composite material which comprises the microparticles of claim 1 dispersed in and bound by an organic or inorganic binder.

7. An electromagnetic radiation absorptive coating which comprises the microparticles of claim 1 mixed with an organic or inorganic binder and forming a coating on a substrate.

8. A fabric having a coating containing the microparticles as defined in claim 1 imparting electromagnetic radiation absorptive properties to the fabric.

9. A paint coating containing the microparticles as defined in claim 1 imparting electromagnetic radiation absorptive properties to the paint.

10. A laminate containing at least one layer which contains the microparticles as defined in claim 1.

11. An electromagnetic radiation absorptive composition which comprises an electromagnetic radiation non-absorptive binder; and a multiplicity of electromagnetic radiation absorptive microparticles dispersed in said binder, said microparticles having a diameter of from 1 to 500 microns and an aspect ratio of less than 10 to 1, said particles coated with an essentially water insoluble inorganic composition; wherein said inorganic coating composition comprises one or more of the compounds formed when one or more of the following metals: silver, nickel, copper, iron, palladium, cobalt, chromium, manganese, cadmium, tin, lead, antimony, tungsten, titanium, vanadium, zirconium, aluminum, molybdenum, zinc, or their alloys is reacted with one or more of the following non-metallic elements: nitrogen, phosphorus, arsenic, silicon, oxygen, carbon, sulfur, selenium, tellurium, fluorine, chlorine, bromine, iodine, and boron; said inorganic coating being present on the microparticles at 0.01% to 200% by weight.

12. A structure which absorbs electromagnetic radiation comprising a substrate and an electromagnetic radiation absorptive coating carried by the substrate, said coating comprising a binder and a multiplicity of inorganic coated microparticles dispersed in and bound by said binder, said microparticles having a diameter of from 1 to 500 microns and an aspect ratio of less than 10 to 1, said particles coated with an essentially water insoluble inorganic composition; wherein said inorganic coating composition comprises one or more of the compounds formed when one or more of the following metals: silver, nickel, copper, iron, palladium, cobalt, chromium, manganese, cadmium, tin, lead, antimony, tungsten, titanium, vanadium, zirconium, aluminum, molybdenum, zinc, or their alloys is reacted with one or more of the following non-metallic elements: nitrogen, phosphorus, arsenic, silicon, oxygen, carbon, sulfur, selenium, tellurium, fluorine, chlorine, bromine, iodine, and boron; said inorganic coating being present on the microparticles at 0.01% to 200% by weight.

13. A structure which absorbs electromagnetic radiation comprising an electrically conductive substrate, a microwave absorbing layer overlying said substrate, and an infrared absorbing layer overlying said microwave absorbing layer, said infrared absorbing layer comprising a binder and a multiplicity of microparticles dispersed in and bound by said binder, said microparticles having a diameter of from 1 to 500 microns and an aspect ratio of less than 10 to 1, said particles coated with an essentially water insoluble inorganic composition; wherein said inorganic coating composition comprises one or more of the compounds formed when one or more of the following metals: silver, nickel, copper, iron, palladium, cobalt, chromium, manganese, cadmium, tin, lead, antimony, tungsten, titanium, vanadium, zirconium, aluminum, molybdenum, zinc, or their alloys is reacted with one or more of the following non-metallic elements: nitrogen, phosphorus, arsenic, silicon, oxygen, carbon, sulfur, selenium, tellurium, fluorine, chlorine, bromine, iodine, and boron; said inorganic coating being present on the microparticles at 0.01% to 200% by weight.

14. A structure as defined in claim 13 additionally including a top coating of a composition which is essentially non-absorptive to microwave radiation overlying said electromagnetic radiation absorptive coating and defining the outermost surface of said structure.

15. A terrestrial vehicle having a coating as defined in claim 12, 13 or 14.

16. An air vehicle having a coating as defined in claim 12, 13, or 14.

17. A space vehicle having a coating as defined in claim 12, 13, or 14.

18. A water vehicle having a coating as defined in claim 12, 13, or 14.

19. An atmospheric re-entry vehicle having a coating as defined in claim 12, 13, or 14.

20. A radar antenna having a coating as defined in claim 12, 13, or 14.

21. A projectile having a coating as defined in claim 12, 13, or 14.

* * * * *